US012676953B2

(12) United States Patent
Pabst et al.

(10) Patent No.: US 12,676,953 B2
(45) Date of Patent: Jul. 7, 2026

(54) DEVICE FOR DETERMINING A PARASITIC RESISTANCE IN VIDEO ENDOSCOPES

(71) Applicant: OLYMPUS WINTER & IBE GMBH, Hamburg (DE)

(72) Inventors: Sven Pabst, Giekau (DE); Sebastian Jungbauer, Hamburg (DE)

(73) Assignee: OLYMPUS Winter & Ibe GmbH, Hamburg (DE)

( * ) Notice: Subject to any disclaimer, the term of this patent is extended or adjusted under 35 U.S.C. 154(b) by 617 days.

(21) Appl. No.: 17/398,234

(22) Filed: Aug. 10, 2021

(65) Prior Publication Data

US 2021/0368160 A1     Nov. 25, 2021

Related U.S. Application Data

(63) Continuation of application No. PCT/EP2020/052570, filed on Feb. 3, 2020.

(30) Foreign Application Priority Data

Feb. 11, 2019    (DE) .......................... 102019103287.3

(51) Int. Cl.
    *H04N 17/00*        (2006.01)
    *G01R 27/02*        (2006.01)
    *G01R 31/28*        (2006.01)
(52) U.S. Cl.
    CPC ............. *H04N 17/00* (2013.01); *G01R 27/02* (2013.01); *G01R 31/2825* (2013.01)
(58) Field of Classification Search
    CPC ..... H04N 17/00; G01R 27/02; G01R 31/2825
    See application file for complete search history.

(56) References Cited

U.S. PATENT DOCUMENTS

| | | | |
|---|---|---|---|
| 5,402,769 A | 4/1995 | Tsuji | |
| 2008/0048639 A1* | 2/2008 | Sutono | G01R 1/06772 |
| | | | 324/76.19 |
| 2011/0193948 A1* | 8/2011 | Amling | A61B 1/00029 |
| | | | 348/E7.085 |

(Continued)

FOREIGN PATENT DOCUMENTS

| | | |
|---|---|---|
| JP | H0694799 A | 4/1994 |

OTHER PUBLICATIONS

English Translation of JP 2016033511 (Year: 2016).*
International Search Report dated Apr. 23, 2020 issued in PCT/EP2020/052570.

*Primary Examiner* — Patrick N Edouard
*Assistant Examiner* — Eboni N Giles
(74) *Attorney, Agent, or Firm* — Scully, Scott, Murphy & Presser, P.C.

(57)          ABSTRACT

A device for determining a parasitic resistance of an electronic circuit for a video endoscope, the device including: a potential determining device; a printed circuit board; and a potential-determining conductor which is connected to the potential-determining device, the potential-determining conductor being situated on the printed circuit board. Wherein the potential-determining conductor is arranged along a path on the printed circuit board next to a reference potential conductor, and the potential-determining device is configured to determine a parasitic resistance between the potential-determining conductor and the reference potential conductor.

18 Claims, 2 Drawing Sheets

(56)         References Cited

U.S. PATENT DOCUMENTS

| | | | |
|---|---|---|---|
| 2015/0066399 A1 | 3/2015 | Kasai | |
| 2015/0145552 A1* | 5/2015 | Korpela | G01N 17/00 |
| | | | 324/763.01 |
| 2017/0013709 A1* | 1/2017 | Matsumoto | H05K 1/0268 |
| 2018/0128870 A9* | 5/2018 | Shibata | G01R 31/2817 |

* cited by examiner

DEVICE FOR DETERMINING A PARASITIC RESISTANCE IN VIDEO ENDOSCOPES

CROSS-REFERENCE TO RELATED APPLICATION

The present application is a continuation of PCT/EP2020/052570 filed on Feb. 3, 2020, which is based upon and claims the benefit to DE 10 2019 103 287.3 filed on Feb. 11, 2019, the entire contents of each of which are incorporated herein by reference.

BACKGROUND

Field

The present disclosure relates to video endoscopes and more particularly to a device for determining a parasitic resistance of an electronic circuit for a video endoscope, comprising a potential-determining conductor which is connected to a potential-determining device, wherein the potential-determining conductor is situated on a printed circuit board.

Prior Art

The functioning of electronic circuits in video endoscopes can be influenced by parasitic resistances. A parasitic resistance is an unreliable resistance between two independent signals or levels or conductors of an electronic circuit. There are electronic circuits that are sensitive to faults of this kind, for example analog-digital converters (ADC) or comparators, which are operated by means of high-ohmic voltage dividers or high-resistance voltage dividers. Parasitic resistances can occur during operation of endoscopes, such as in video endoscopes, for example if the video endoscope comes into contact with conductive particles or moisture or if there is an ingress of water. Typically, video endoscopes have a hermetic space, in which optical systems are arranged, for example, and a non-hermetic space, which is provided in a handle, for example. During autoclaving of video endoscopes, it is possible, for example, for moisture to enter the handle and thus cause problems with parasitic resistances.

SUMMARY

An object is to provide a device for determining a parasitic resistance of an electronic circuit for a video endoscope that enables reliable determination of a parasitic resistance and that is as cost-effective as possible, for example through the use of only a few or no additional components of the electronic circuit.

Such object can be achieved by a device for determining a parasitic resistance of an electronic circuit for a video endoscope, comprising a potential-determining conductor which is connected to a potential-determining device, wherein the potential-determining conductor is situated on a printed circuit board, wherein the potential-determining conductor is arranged along a path on the printed circuit board next to a reference potential conductor, wherein a parasitic resistance can be determined between the potential-determining conductor and the reference potential conductor.

By providing the device, it is possible to reliably and accurately determine a parasitic resistance between the potential-determining conductor and the reference potential conductor, such as by the potential-determining device. As a result, in the regions of the printed circuit board in which both a reference potential conductor and a potential-determining conductor are provided, it can be reliably determined whether parasitic resistances are present, for example on account of moisture. If multiple potential-determining conductors are provided which are arranged in different regions of the printed circuit board or in different sections of the printed circuit board, and next to a reference potential conductor in each case, wherein said reference potential conductor has or may have the same reference potential, it is even possible to establish the region of the printed circuit board in which parasitic resistances are present.

The parasitic resistance can be determined during operation or during start-up of the electronic circuit of the video endoscope, i.e., during operation or during start-up of the video endoscope.

A path on the printed circuit board can be understood to mean a spatial extent or a portion or region of the printed circuit board that is elongated. The path can be a longitudinal extent of the printed circuit board.

The length of the path can be at least one quarter, such as, at least one half of an extent of the printed circuit board. As a result, it can be determined over a large region of the printed circuit board whether a parasitic resistance is present. An integral can be formed over various parasitic resistances as a result. The length of the path can be greater than or equal to ⅔ or greater than or equal to ¾ or greater than or equal to 1.25 or greater than or equal to 1.5 times the extent of the printed circuit board, such as in the longitudinal extension of the printed circuit board. The length of the path can be less than 100 times, such as, less than 50 times, less than 20 times, less than 10 times the size of the longitudinal extent of the printed circuit board.

The potential-determining conductor can be arranged on the printed circuit board in a meandering pattern.

The distance between the potential-determining conductor and the reference potential conductor in the regions in which these are arranged one next to the other can be substantially the same. As a result, the parasitic resistance can be determined very accurately. If the distance between the potential-determining conductor and the reference potential conductor in the region in which these are arranged one next to the other is less than or equal to one half, such as one quarter of the distance from the potential-determining conductor to another conductor that has a different potential to the reference potential conductor, the parasitic resistance can be effectively prevented from being compensated by a parasitic resistance between the potential-determining conductor and said other conductor. The other conductor can be the conductor that is closest to the potential-determining conductor after the reference potential conductor, which is closer to the potential-determining conductor.

The ratio of the distance between the potential-determining conductor and the reference potential conductor to the distance between the potential-determining conductor and the other conductor can be ⅓, ¼, ⅕, 1/10 or even smaller.

The distance can be determined perpendicularly to the potential-determining conductor.

The potential-determining conductor can be surrounded on at least two sides by the reference potential conductor. This makes the result even more accurate.

The potential-determining device can be an analog-digital converter or can comprise an analog-digital converter, wherein the analog-digital converter can be provided in a microcontroller or as an alternative function in a microcontroller, wherein the microcontroller can be a microcontroller that is provided for an electronic circuit for a video endo-scope and that performs at least one other function of the electronic circuit of the video endoscope.

Said other function of the electronic circuit may be actuation or control of an image-capturing device.

An analog-digital converter provided in the potential-determining device converts an analog voltage Vin (voltage to be measured) into a digital value um. For example, a piece of software compares the digital value with a limit value in order to make a true-false decision. For example, "true" may be provided when the measured value is greater than the limit value and "false" when the measured value is less than or equal to the limit value. Depending on the measuring circuit used, this makes it easy to identify a parasitic resistance.

The potential-determining device may also be configured to be analog.

As an alternative to the analog-digital converter, a com-parator circuit may be used. In this case, no analog-digital conversion and no software are required. The comparator circuit compares the voltage to be measured or input voltage Vin with a reference voltage Vref (see FIGS. 4 and 5). At the output of this circuit, an item of true-false information can be picked off from the output signal based on a HIGH or LOW level. The output voltage Vout is for example "HIGH" when the input voltage is greater than the reference voltage and the output voltage is for example "LOW" when the input voltage is less than or equal to the reference voltage. If the limit value has to be changed, only the reference voltage needs to be changed. A hysteresis can be provided in order to enable stable functioning of the comparator.

The potential-determining conductor can be connected to a voltage divider. For this purpose, the potential-determining conductor runs between two resistors of the voltage divider, such that the potential-determining conductor has a precisely predefined potential if no parasitic resistance is present. In the case where a parasitic resistance is present, the magni-tude of the parasitic resistance can be easily determined via the measured potential at the potential-determining conduc-tor.

Alternatively, the potential-determining conductor can be provided between a pull-up resistor and ground, wherein the parasitic resistance can be determined between the potential-determining conductor and ground. As a result, it is possible to determine parasitic resistances without additional elec-tronic components of the electronic circuit for a video endoscope.

The potential-determining conductor can be provided between a pull-down resistor and a reference potential conductor, wherein the parasitic resistance can be deter-mined between the potential-determining conductor and the reference potential conductor. This therefore also makes it possible to determine parasitic resistances without addi-tional electronic components of the electronic circuit for a video endoscope.

An electronic circuit for a video endoscope can be pro-vided with a device of the like described above.

Furthermore, a video endoscope can be provided with the electronic circuit described above.

If the device is arranged in a non-hermetic space of the video endoscope, such as at least in part in a handle of the video endoscope, possible parasitic resistances can be deter-mined very efficiently.

BRIEF DESCRIPTION OF THE DRAWINGS

Further features will become evident from the description of embodiments, together with the claims and the appended drawings. Embodiments can implement individual features or a combination of multiple features.

The embodiments are described below, without restricting the general idea of the invention, based on exemplary embodiments in reference to the drawings, whereby we expressly refer to the drawings with regard to all details that are not explained in greater detail in the text. In the figures.

In the drawings, the same or similar elements and/or parts are, in each case, provided with the same reference numerals such that they are not introduced again in each case.

DETAILED DESCRIPTION

Figure 1:
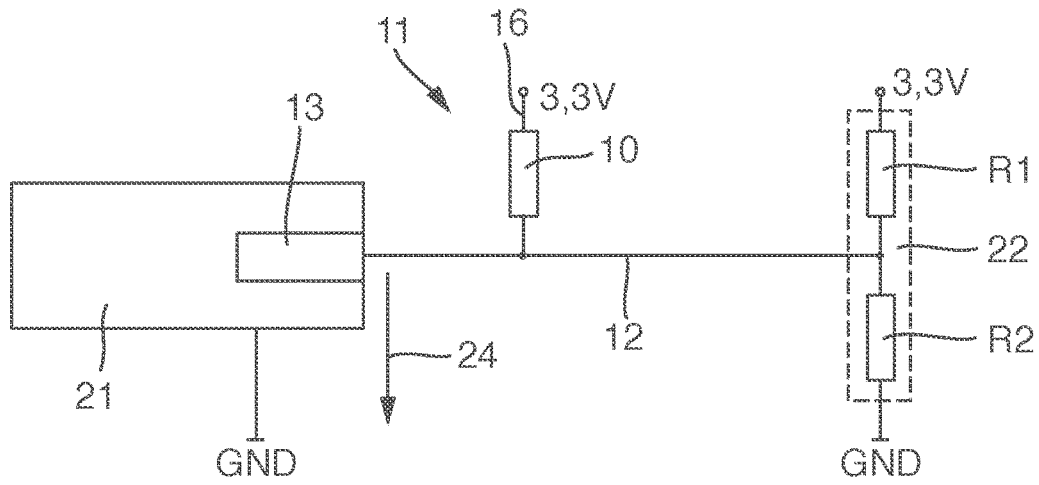
FIG. 1 schematically illustrates a device for determining a parasitic resistance of an electronic circuit in a first embodiment, FIG. 2 schematically illustrates a device for determining a parasitic resistance of an electronic circuit for a video endoscope in a second embodiment.

FIG. 1 schematically shows a circuit diagram of a device for determining a parasitic resistance 10 of an electronic circuit 11 for a video endoscope. A microcontroller 21 having an analog-digital converter 13, or AD converter, is provided. The input of the AD converter 13 is connected to a potential-determining conductor 12, to which a potential that corresponds to a voltage 24 to be measured is applied. The potential-determining conductor 12 is connected to a voltage divider 22, which comprises two resistors R1, R2. The potential-determining conductor 12 is connected to the voltage divider 22 between these two resistors R1, R2. A reference potential conductor 16 having a potential of, by way of example, 3.3 volts is provided. The voltage divider 22 has 3.3 volts on one side and is connected to ground GND on the other side.

In the presence of a parasitic resistance 10 between the potential-determining conductor 12 and the reference poten-tial conductor 16, the voltage 24 to be measured is different than in the absence of a parasitic resistance 10. The parasitic resistor 10 is connected in parallel to the resistor R1 of the voltage divider 22, such that the parasitic resistance 10 can easily be determined.

Figure 2:
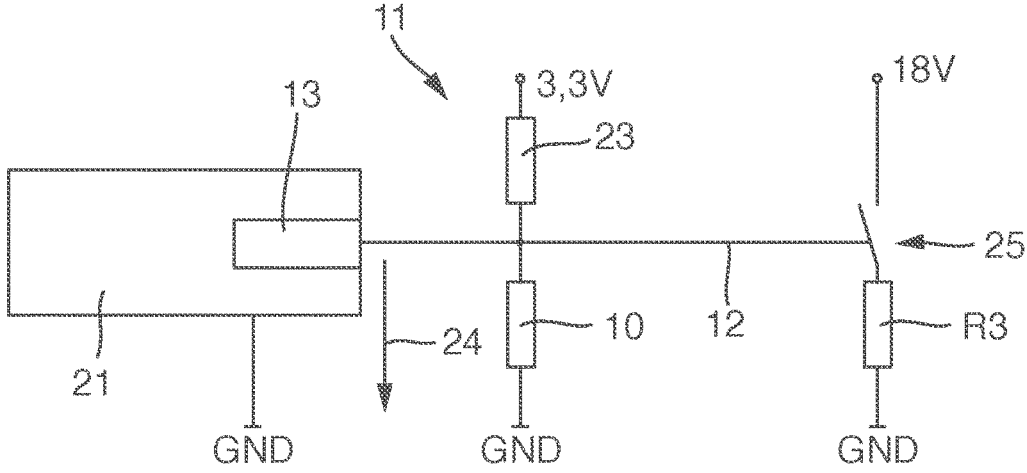

FIG. 2 schematically shows a circuit diagram of another embodiment of a device for determining a parasitic resis-tance 10 of an electronic circuit 11 for a video endoscope. In this case, the parasitic resistance 10 is determined function-ally such that no additional components are required per se for the electronic circuit, which is provided for a video endoscope. For this purpose, an output of the microcon-troller 21 is used as a switching output as opposed to an analog-digital converter after start-up of the microcontroller 21.

When the microcontroller 21 has been started up, the potential determining conductor 12 serves as a switching signal in that the switch 25, which switches a load resistor R3 to 18 volts, is used to determine parasitic resistances 10 when the microcontroller 21 is being started up. During start-up, the switch 25 is open and the output of the microcontroller 21 can be used as an analog-digital con-verter if a pull-up resistor 23 is provided as in FIG. 2. For the case shown in FIG. 2, the potential-determining conductor 12 is arranged opposite ground or along a certain path with a ground conductor as the reference potential conductor.

For the case not shown, in which a pull-down resistor is provided, i.e., for the case in which the resistors 23 and 10 are swapped with respect to FIG. 2, the potential-determining conductor 12 would, in this example, be arranged on a path of the printed circuit board next to a potential of 3.3 volts provided as the reference potential conductor.

Figure 3:
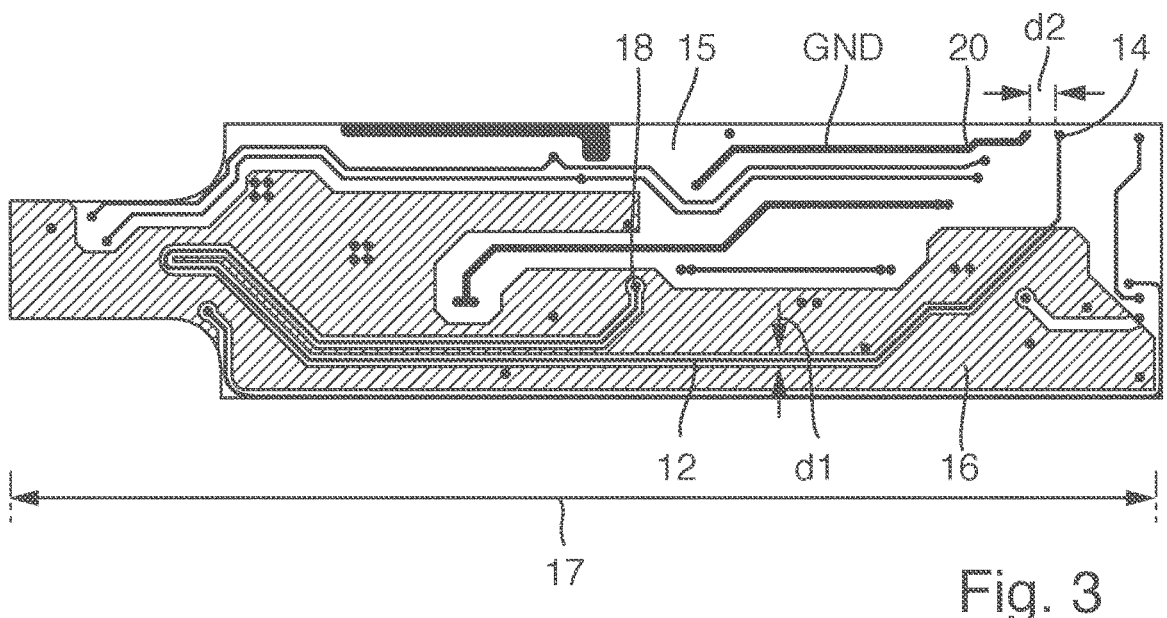
FIG. 3 is a schematic plan view illustration of a printed circuit board for a device.

FIG. 3 schematically shows a printed circuit board of an electronic circuit on which a device for determining a parasitic resistance 10 is arranged. Some conductor tracks are shown, the function of which is not specified here. The potential-determining conductor 12 runs from the top-right region from a contact 14 for the potential-determining device 13 over a relatively long path in the longitudinal extension of the printed circuit board 15 to a contact 18 for the voltage divider 22.

The potential-determining conductor 12 is arranged substantially in parallel next to the reference potential conductor 16 over the longest part of the path and said conductors are arranged at a short distance d1 from one another. The distance d1 is the same size everywhere, if possible. A parasitic resistance 10 can be measured over this distance d1. In this exemplary embodiment, the reference potential is, by way of example, 3.3 volts. The path in which the potential-determining conductor 12 and the reference potential conductor 16 are arranged in parallel or next to one another can be seen to correspond to almost 1.5 times the longitudinal extent of the printed circuit board 15. As a result, a parasitic resistance can be determined very accurately.

It is also important that the distance d2 from the potential-determining conductor 12 to the next conductor 20 having another potential, for example ground GND, is significantly greater than the distance to the reference potential conductor 16. This causes fewer measurement errors during determination of the parasitic resistance 10. The longitudinal extent of the printed circuit board 15 is shown by the reference number 17 in FIG. 3.

Figures 4, 5:
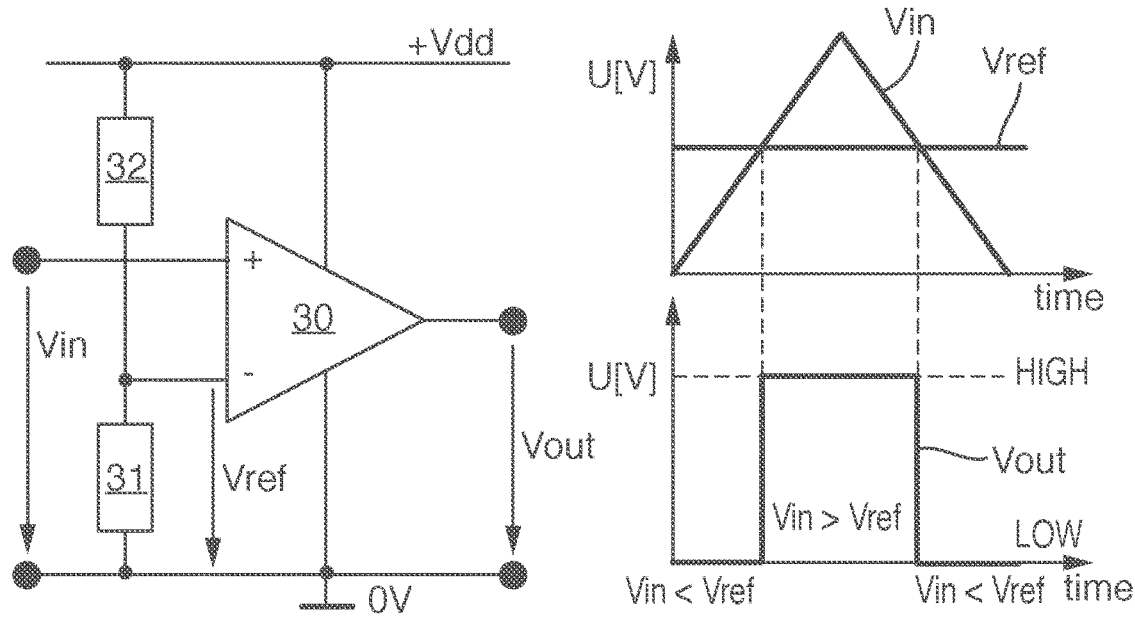
FIG. 4 illustrates a schematic circuit of a comparator.
FIG. 5 illustrates, at the top, a diagram of voltages over time and, at the bottom, a diagram of an output signal of the comparator for the voltage curves shown in the top diagram.

FIG. 4 is a schematic circuit diagram of a comparator. An input voltage Vin is applied to an input of a differential amplifier 30. The reference voltage Vref is applied to the other input of the differential amplifier 30. The comparator is supplied with a supply voltage Vdd. In addition, the reference voltage Vref is between two resistors 31 and 32, which are between the reference voltage Vdd and ground, i.e., GND or 0 volts. The configuration of a comparator, which is common per se, can be used instead of the analog-digital converter, namely as the potential-determining device 13 in FIGS. 1 and 2.

FIG. 5 shows voltage curves over time. When the input voltage Vin is less than or equal to the reference voltage, the output signal is LOW. When the input voltage is greater than the reference voltage, the output signal Vout is HIGH.

In order to prevent the comparator from switching over too frequently and irregularly on account of minor fluctuations of the input voltage or reference voltage, the comparator can be provided with a hysteresis and configured as a Schmitt trigger.

In this way, the potential-determining device can be analog in configuration.

While there has been shown and described what is considered to be particular embodiments, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

LIST OF REFERENCE NUMBERS

10 Parasitic resistance or resistor
11, 11' Electronic circuit
12 Potential-determining conductor
13 Potential-determining device
14 Contact for potential-determining device
15 Printed circuit board
16 Reference potential conductor
17 Printed circuit board extent
18 Contact for voltage divider
20 Conductor
21 Microcontroller
22 Voltage divider
23 Pull-up resistor
24 Voltage to be measured
25 Switch
30 Differential amplifier
31, 32 Resistor
d1 Distance
d2 Distance
GND Ground
R1, R2, R3 Resistor
Vin Input voltage
Vref Reference voltage
Vout Output voltage
Vdd Supply voltage

What is claimed is:

1. A device for determining a parasitic resistance of an electronic circuit for a video endoscope, the device comprising:
   a potential-determining device;
   a printed circuit board external from the potential-determining device; and
   a potential-determining conductor arranged on the printed circuit board, wherein a first end of the potential-determining conductor is connected to the potential-determining device via a contact on the printed circuit board, the potential-determining conductor extending in a longitudinal direction on a surface of the printed circuit board,
   a circuit component connected to a second end of the potential-determining conductor, wherein a predefined potential of the potential-determining conductor is dependent on the circuit component;
   wherein the potential-determining conductor is arranged along a path in the longitudinal direction on the surface of the printed circuit board next to a reference potential conductor,
   the potential-determining device is configured to determine a parasitic resistance between the potential-determining conductor and the reference potential conductor based on a deviation of the predefined potential of the potential-determining conductor;
   the potential-determining conductor is surrounded on at least two sides, in a direction orthogonal to the longitudinal direction, by the reference potential conductor on the surface of the printed circuit board; and
   the reference potential conductor is at a voltage other than zero.

2. The device according to claim 1, wherein a length of the path is at least one quarter of an extent of the printed circuit board.

3. The device according to claim 2, wherein the length of the path is at least one half of the extent of the printed circuit board.

4. The device according to claim 1, wherein a first distance between the potential-determining conductor and the reference potential conductor in regions in which the potential-determining conductor and the reference potential conductor are arranged next to each other is substantially the same.

5. The device according to claim 4, wherein the first distance is less than or equal to one half of a second distance from the potential-determining conductor to another conductor that has a different potential to the reference potential conductor.

6. The device according to claim 1, wherein the potential-determining device comprises an analog-digital converter.

7. The device according to claim 6, wherein the analog-digital converter is provided in a microcontroller.

8. The device according to claim 6, wherein the analog-digital converter is provided as an alternative function in a microcontroller.

9. The device according to claim 6, wherein the analog-digital converter is a microcontroller, the microcontroller being provided for an electronic circuit for a video endoscope, the microcontroller being configured to perform at least one other function of the electronic circuit of the video endoscope.

10. The device according to claim 1, wherein the circuit component is a voltage divider.

11. The device according to claim 1, wherein the circuit component is a switch, and the potential-determining conductor is connected between a pull-up resistor and ground, and the parasitic resistance is determined between the potential-determining conductor and the ground when the switch is opened.

12. The device according to claim 1, wherein the circuit component is a switch, and the potential-determining conductor is connected between a pull-down resistor and a reference potential conductor, and the parasitic resistance is determined between the potential-determining conductor and the reference potential conductor when the switch is opened.

13. An electronic circuit for a video endoscope comprising a device according to claim 1.

14. A video endoscope comprising an electronic circuit according to claim 13.

15. The video endoscope according to claim 14, where the device is arranged in a non-hermetic space of the video endoscope.

16. The video endoscope according to claim 15, wherein the device is arranged in at least in part of a handle of the video endoscope.

17. The device according to claim 1, wherein the electronic circuit is configured to control an actuation of an image-capturing device.

18. The device according to claim 1, wherein the potential-determining device comprises a comparator configured to compare a voltage applied to the potential-determining conductor with a reference voltage.

* * * * *